(12) United States Patent
Halder et al.

(10) Patent No.: US 7,032,151 B2
(45) Date of Patent: Apr. 18, 2006

(54) SYSTEMS AND METHODS FOR TESTING INTEGRATED CIRCUITS

(75) Inventors: Achintya Halder, Atlanta, GA (US); Abhijit Chatterjee, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 598 days.

(21) Appl. No.: 10/292,976

(22) Filed: Nov. 13, 2002

(65) Prior Publication Data

US 2003/0093730 A1 May 15, 2003

Related U.S. Application Data

(60) Provisional application No. 60/338,500, filed on Nov. 13, 2001.

(51) Int. Cl.
*G06F 11/00* (2006.01)
(52) U.S. Cl. .................. 714/740; 714/727; 714/741
(58) Field of Classification Search ............... 341/120; 714/727, 30, 724, 726, 733, 740, 741; 324/158.1

See application file for complete search history.

(56) References Cited

U.S. PATENT DOCUMENTS 5,225,834 A * 7/1993 Imai et al. ................. 341/120
5,793,778 A * 8/1998 Qureshi ..................... 714/727
5,872,908 A * 2/1999 Whetsel ...................... 714/30
5,974,578 A * 10/1999 Mizokawa et al. ......... 714/727
6,331,770 B1 * 12/2001 Sugamori ................. 324/158.1
6,653,827 B1 * 11/2003 Gaither et al. ........... 324/158.1

OTHER PUBLICATIONS

Brian R. Wilkins, "An Introduction to IEEE-1149.4 Analog and Mixed-Signal Boundary-Scan Test," Copyright 1999-2001 ChipCenter, pp. 1-13.
Dr. R. G. "Ben" Bennetts, "Tech Note: Boundary-Scan Testing, Part 1: An Introduction,"Copyright 1999 ChipCenter, pp. 1-3, http://www.chipcenter.com/TestandMeasurement/tn037.html?PRINT=true.
Dr. R. G. "Ben" Bennetts, "Tech Note: A Closer Look," Copyright 1999 ChipCenter, pp. 1-4, http://www.chipcenter.com/TestandMeasurement/tn037.html?PRINT=true.
Rick Nelson, "Implement Analog PCB Tests Pending IEEE 1149.4's Emergence," Mar. 2, 2000, pp. 1-4, http://www.tmworld.com/articles/2000/03_PCB.htm.

* cited by examiner

*Primary Examiner*—David Ton
(74) *Attorney, Agent, or Firm*—Thomas, Kayden, Horstemeyer & Risley, LLP (57) ABSTRACT

Systems and methods for digital-based, standards-compatible, testing of analog circuits embedded inside integrated circuits. In this regard, one such system can be broadly described by a test stimulus generator that transmits a binary-level test-stimulus signal into an analog circuit located inside an integrated circuit; a converter that converts an analog output signal from the analog circuit into a digital output signal; a boundary-scan register chain that transmits the digital output signal out of the integrated circuit, and a test equipment that receives the digital output signal using the IEEE 1149.1 boundary-scan standard and analyzes the digital output signal to compute one or more specifications of the analog circuit located inside the integrated circuit.

22 Claims, 10 Drawing Sheets

SYSTEMS AND METHODS FOR TESTING INTEGRATED CIRCUITS

CROSS-REFERENCE TO RELATED APPLICATIONS

The present application claims priority to, and the benefit of, U.S. Provisional Patent Application Ser. No. 60/338,500, filed on Nov. 13, 2001.

TECHNICAL FIELD

This disclosure generally relates to testing of electronic circuitry. More specifically, the invention relates to testing of analog circuits embedded inside integrated circuits (ICs).

DESCRIPTION OF RELATED ART

Assembly-line testing as well as repair-related testing of printed circuit board (PCB) assemblies and integrated circuits (ICs) were relatively easier when single-sided PCBs and through-hole IC packages were prevalent. Such testing was typically carried out using a bed-of-nails approach, which was feasible due to the relatively easy access to printed circuit pads, through-hole vias, and component input/output (I/O) pins. With the advent of surface mount technology, dense IC packages, and multi-layer PCBs, the bed-of-nails approach became less attractive. Alternative testing techniques that encompassed features such as automated testing, self-testing, and testing using built-in test circuits, were created to address these technological developments.

The Institute of Electrical and Electronics Engineers (IEEE) formed special committees to generate test standards that would assist multiple manufacturers and equipment vendors to carry out testing on various electronic circuits in a standardized manner. One such committee, termed the Joint Test Access Group (JTAG) generated several standards for testing PCBs and ICs using a boundary-scan technique that utilizes test-related hardware built inside ICs.

The IEEE 1149.1 Test Access Port and Boundary-Scan Standard is a test scheme to test digital ICs using embedded boundary-scan hardware and a four-wire test bus. The IEEE 1149.4 standard was developed subsequently to test ICs containing mixed-signal—digital as well as analog, using a six-wire test bus while remaining backwards-compatible to the IEEE 1149.1 standard.

At an IC level, the IEEE 1149.1 standard requires that each primary input pin and each primary output pin of an IC be supplemented with a multi-purpose element called a "boundary-scan cell." Each boundary-scan cell contains at least one flip-flop. Multiple such flip-flops of different boundary-scan cells can be cascaded to form a boundary-scan test chain.

Figure 1:
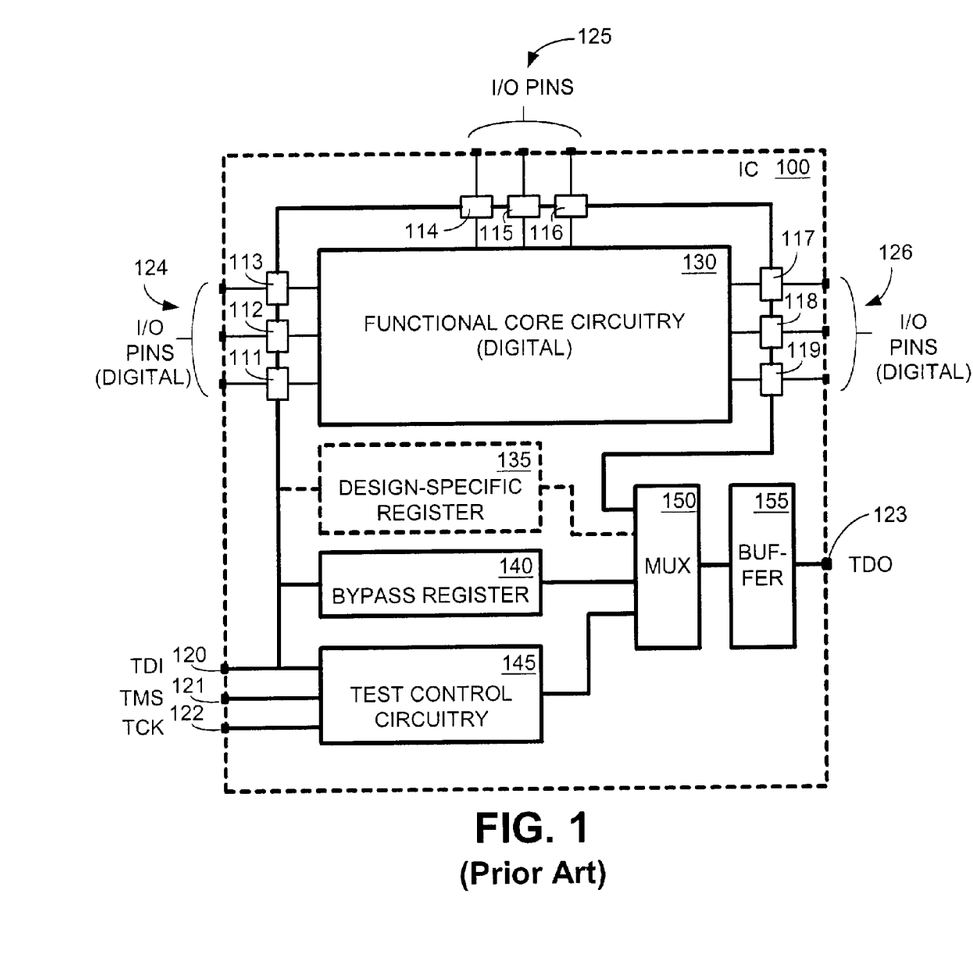
FIG. 1 is a prior-art illustration of the major functional blocks used to implement IEEE 1149.1 standards-compliant testing of a digital integrated circuit.

Drawing reference to FIG. 1 which shows the major functional blocks necessary to implement IEEE 1149.1 on a digital IC, the boundary scan registers 111 through 119 that are connected to the I/O pins 124, 125, 126 of IC 100, can be cascaded together to form a test chain referred to as a boundary-scan register chain. A boundary scan register operates independent of the digital functional core circuitry 130, which is the primary circuit contained in IC 100. In test mode, a digital signal fed into input pin TDI (Test Data In) 120 constitutes an input signal into the boundary-scan register chain, and the resultant output digital signal of the boundary-scan register chain appears on the output pin TDO (Test Data Out) 123. Boundary-scan testing provides information related to electrical short-circuits and open-circuits of the I/O pins of IC 100 that are typically soldered on to metal pads on a PCB.

TMS (Test Mode Select) 121 and TCK (Test Clock) 122 are two other pins that form together with TDI 120 and TDO 123, the external test interface pins specified by the IEEE 1149.1 standard. These four test interface I/O pins, collectively referred to as a test access port (TAP), permit test equipment to gain test-access to the I/O pins 124, 125, and 126 of the IC 100 via the boundary scan register without the necessity of test probes making direct physical contact with any of the individual I/O pins. This type of "indirect" access eliminated the need for a bed-of-nails approach.

Bypass register 140 allows IC 100 to be removed from a boundary scan chain at a PCB-level, where typically several ICs are cascaded together by connecting the TDO pin of one IC to the TDI pin of a neighboring IC. IC designers may optionally use additional registers, such as design-specific register 135, to provide individualized user-defined test capabilities. Such test capabilities may include testing of digital circuitry embedded inside the functional core circuitry by using the boundary-scan register. The flip-flops inside the digital core are serially connected to form a register chain. The testing of faults such as internal short-circuits and open-circuits, may be carried out by providing test-stimulus in the form of a digital data input stream via TDI 120, initializing all the internal flip-flops and capturing the responsive digital data output data stream at the TDO 123 pin.

Test control circuitry 145 contains circuits such as a TAP controller, an instruction register, and an instruction decoder. Control signals are used both for the transfer of data and for selecting alternative test paths such as through bypass register 140. These control signals are provided partly by the TAP controller and partly by the instruction decoder, after interpretation of any specific test-instruction loaded into the instruction register.

A test-instruction is a bit-pattern that is loaded into the instruction register serially through TDI 120 and is then decoded by the instruction decoder. The test instruction determines the set of test data registers that are selected to operate while the instruction is valid, and it also defines the test data register path that is used to shift data from TDI 120 to TDO 123.

Figure 2:
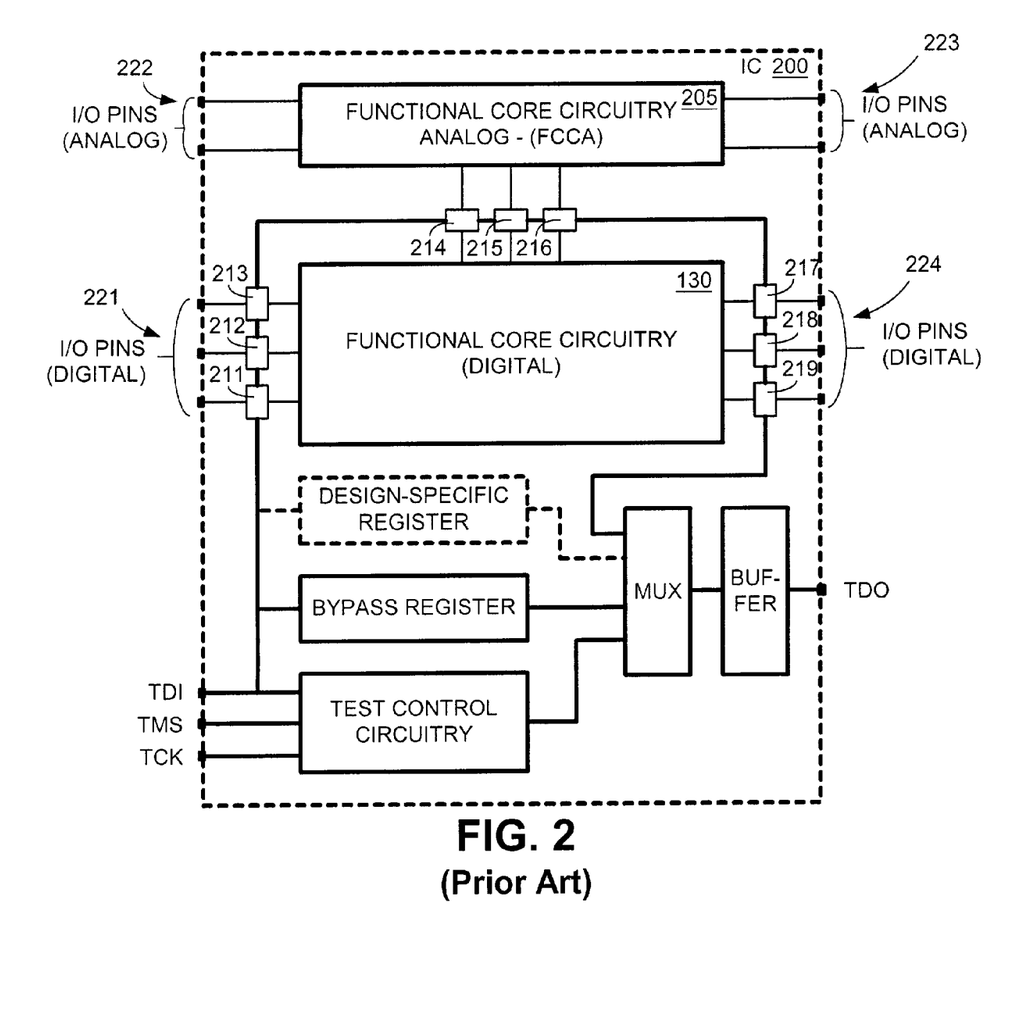
FIG. 2 is a prior-art illustration of the major functional blocks used to implement IEEE 1149.1 standards-compliant testing of a mixed-signal integrated circuit.

Although the IEEE 1149.1 standard primarily catered to digital ICs and did not provide a means to test analog I/O pins of an analog IC, the standard did permit testing of the digital I/O pins in mixed-signal ICs by excluding the analog I/O pins of the IC from the boundary-scan test chain. As an example, FIG. 2 illustrates a mixed-signal IC 200 that may be tested using the IEEE 1149.1 standard.

Boundary scan cells 211 through 219 are cascaded to form the boundary scan register chain. Of these cells, the boundary-scan cells 214, 215, and 216 are contained entirely internal to IC 200 and are not associated with any external I/O pins. The analog functional core circuitry 205 as well as the analog I/O pins 222 and 223 of IC 200 are thus effectively by-passed while testing the digital I/O pins 221 and 224 that are associated with the digital functional core circuitry 130. It can be seen that this type of boundary scan testing, while effective for additionally testing the digital functional core circuitry 130, precludes the testing of the analog functional core circuitry 205 of mixed-signal IC 200.

IEEE 1149.4 addressed the issue of testing mixed-signal ICs by specifying that every I/O pin, digital as well as analog, be provided with a boundary-scan module. While in the case of digital I/O pins, the IEEE 1149.4 boundary-scan module is very similar to the boundary-scan cell of IEEE 1149.1, in the case of analog I/O pins, the IEEE 1149.4 boundary-scan module is referred to as an analog boundary-scan module (ABM).

Figure 3:
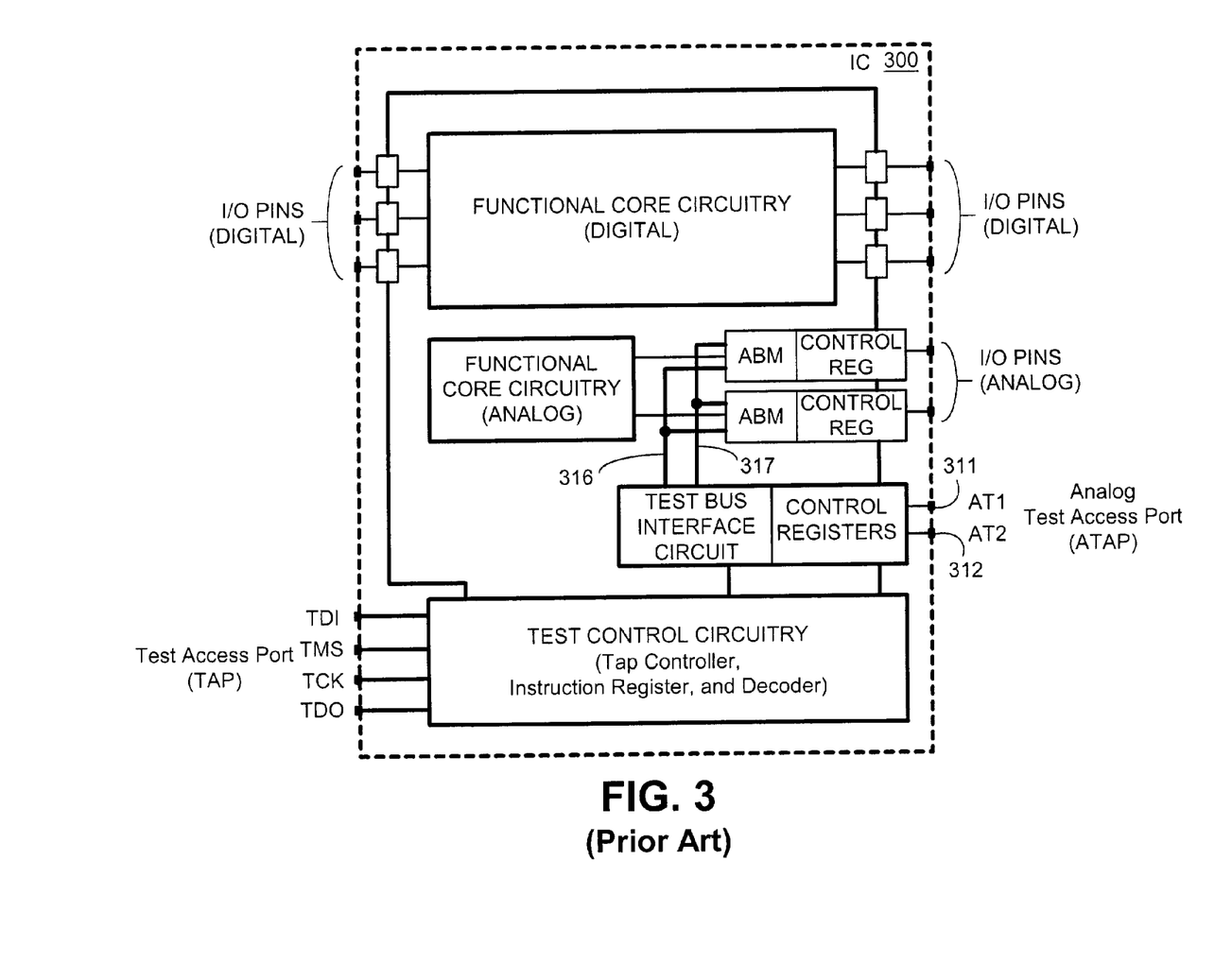
FIG. 3 is a prior-art illustration of the major functional blocks used to implement IEEE 1149.4 standards-compliant testing of a mixed-signal integrated circuit.

An ABM typically employs a switching network connected between an analog I/O pin and the analog core circuitry, thereby permitting the analog I/O pin to be placed in a core-disconnect (CD) state. FIG. 3 illustrates a mixed-signal IC 300 that may be tested using the IEEE 1149.4 standard. Access to two internal analog test buses 316 and 317, are provided through a dedicated pair of pins AT1 311 and AT2 312 that constitute an analog test access port (ATAP).

In general, three types of tests may be performed on an IC designed to accommodate the IEEE 1149.4 standard: interconnect test, parametric test, and internal test. The first type of testing-interconnect testing is used to detect open-circuits in the interconnections between I/O pins and solder pads on a PCB, and to detect and diagnose "bridging" faults anywhere in the interconnection—regardless of whether such interconnections normally carry digital or analog signals, or are of a simple, differential, or extended type of interconnect.

The second type of testing-parametric testing allows analog measurements using analog stimulus and response, permitting for example, impedances of discrete components to be computed, while the third type of testing-internal testing is used to test the performance metrics or the specifications of the functional core circuitry of the IC. This requires the incorporation of test circuitry, such as design-specific register 135 of FIG. 1, to carry out the internal test. In summary, it can be seen that while the IEEE 1149.1 standard permits testing of digital I/O pins and digital core circuitry in a mixed-signal IC, the standard does not permit testing of analog I/O pins and analog circuits located inside the IC. On the other hand, the IEEE 1149.4 standard provides for testing of digital as well as analog I/O pins, and of digital and analog circuits inside a mixed-signal IC. The testing of analog circuits inside such a mixed-signal IC using IEEE 1149.4, requires the incorporation of expensive specialized hardware to provide an analog test-stimulus and to interpret the resulting analog response. In many cases, the analog test-stimulus as well as the test-response analysis is carried out by using expensive automated test equipment (ATE) that is provided outside the IC.

The implementation of IEEE 1149.4 specific resources, such as ATAP and ABMs, take much more area on the IC than the IEEE 1149.1 specific resources. Moreover, the electrical parasitics deteriorate the integrity of the analog test-stimulus signal and the test-response signal transmitted between the ATE and the internal analog core. In order to achieve high signal integrity of the analog test-stimulus signal, the analog test-signal generator is sometimes located inside the IC or placed as close as possible to the I/O pins of the chip on the test-PCB. The same is done for the analog-to-digital converter, which encodes the analog test-response signal into digital data. In such a case, the communication interface between the IC and the tester remains primarily digital. Issues associated with high-speed digital interfaces that utilize electrical conductors, include cost, distancelimitations, electromagnetic interference (EMI), and standards-compatibility. While some of these issues may be resolved by using fiber-optic links, the use of such fiber-optic links adds to the overall cost and complexity of test equipment.

It is therefore desirable to provide a mechanism that is compatible with standards such as IEEE 1149.1, while permitting low-cost testing of analog circuits using a relatively low-speed digital interface carrying digital test-stimulus and digital test-response signals that do not require the use of a DAC or an ADC. Such a mechanism may prove attractive to a wide customer-base due to its standards-compatibility, and its avoidance of the costs and exclusivity associated with a customized analog test circuit for testing analog circuitry inside ICs.

SUMMARY OF THE INVENTION

The present invention provides systems and methods for digital-based, standards-compatible, testing of analog circuits embedded inside integrated circuits. In this regard, one such system, among others, can be broadly described as follows: A binary-level test-stimulus generator transmits a binary-level input signal into an analog circuit located inside an integrated circuit. The output signal from the analog circuit is converted by a converter into a digital output signal, which is then transmitted via a boundary-scan register chain out of the integrated circuit and into a test equipment. The test equipment computes from this digital output signal one or more specifications of the analog circuit.

Other embodiments can be conceptualized as methods for testing analog circuits using a binary-level stimulus. One such method, among others, can be summarized by the following steps: generating a binary-level test stimulus signal whose cycle-period N is equal to a first number of cycle-periods of a system clock, generating a reference signal whose cycle-period N' is equal to a second number of cycle-periods of the system clock, providing the binary-level test signal to an analog circuit-under-test, providing the resulting output signal from the analog circuit-under-test to a first input of an analog comparator circuit, providing the reference signal into a second input of the analog comparator circuit. The ratio of max(N', N) to min(N', N) equals a non-integer value. The output signal from the analog comparator circuit is then provided to a register that is clocked by the system clock, so as to produce a digital output data signal. The digital output signal is then analyzed to compute at least a first specification of the analog circuit-under-test.

Clearly, some embodiments of the invention may exhibit advantages in addition to, or in lieu of, those mentioned above. Additionally, other systems, methods, features and/or advantages of the present invention may become apparent to one with skill in the art upon examination of the following drawings and detailed description. It is intended that all such additional systems, methods, features and/or advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily drawn to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

A detailed description of the present invention is provided with reference to the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 4:
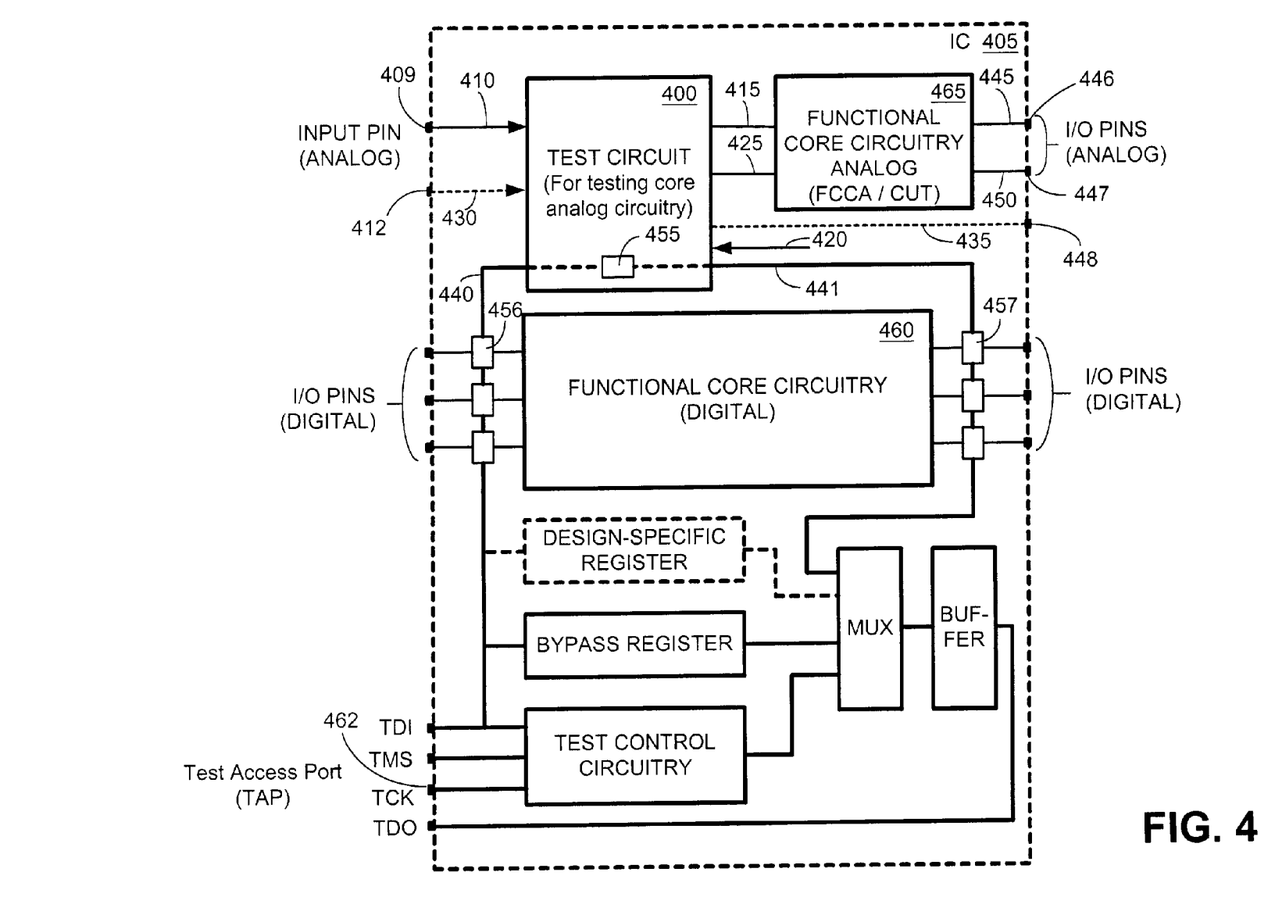
FIG. 4 depicts a mixed-signal integrated circuit incorporating a test circuit of the current invention used for analog circuit testing in compliance with an interface in accordance with the IEEE 1149.1 standard.

FIG. 4 depicts a mixed-signal IC 405 incorporating a test circuit 400 of the current invention used for analog circuit testing in compliance with an interface in accordance with the IEEE 1149.1. The hardware contained inside mixed-signal IC 405 resembles that of mixed-signal IC 200 of FIG. 2, with the difference: addition of the test circuit 400 incorporating a boundary-scan cell 455.

Signal connection 441 is used to cascade boundary-scan cell 455 with boundary-scan cell 456, while signal connection 441 is connected to boundary-scan cell 457. Boundary-scan cells 455 and 457 are part of the boundary scan register chain connected to the digital I/O pins of the functional core circuitry digital (FCCD) 460.

Input pin 409 is an exemplary input pin that is shown connected by signal connection 410 into the test circuit 400. At any instance when IC 405 is not operating in a test mode, an analog signal provided via input pin 409 may be routed through the test circuit 400 into the functional core circuitry analog (FCCA) 465, without any test-related processing being performed upon it. I/O pins 446 and 447 are two exemplary I/O pins connected by signal connections 445 and 450 into the functional core circuitry analog (FCCA) 465. Signal connection 430 is an optional auxiliary input test signal connection that connects input pin 412, which may be optionally a pin dedicated solely for test purposes, to the test circuit 400; while signal connection 435 is an optional auxiliary output test signal connection that connects the test circuit 400 to the output pin 448, which may also be optionally a pin dedicated solely for test purposes. Pin 412, pin 448, line 430, and line 435 are optional and may be incorporated into the mixed-signal IC 405 depending on customized testing requirements. Additionally, connection 420 is used to provide test-related signals from sources inside IC 405. Such sources include one or more FCCAs that may be present inside IC 405.

Figure 5:
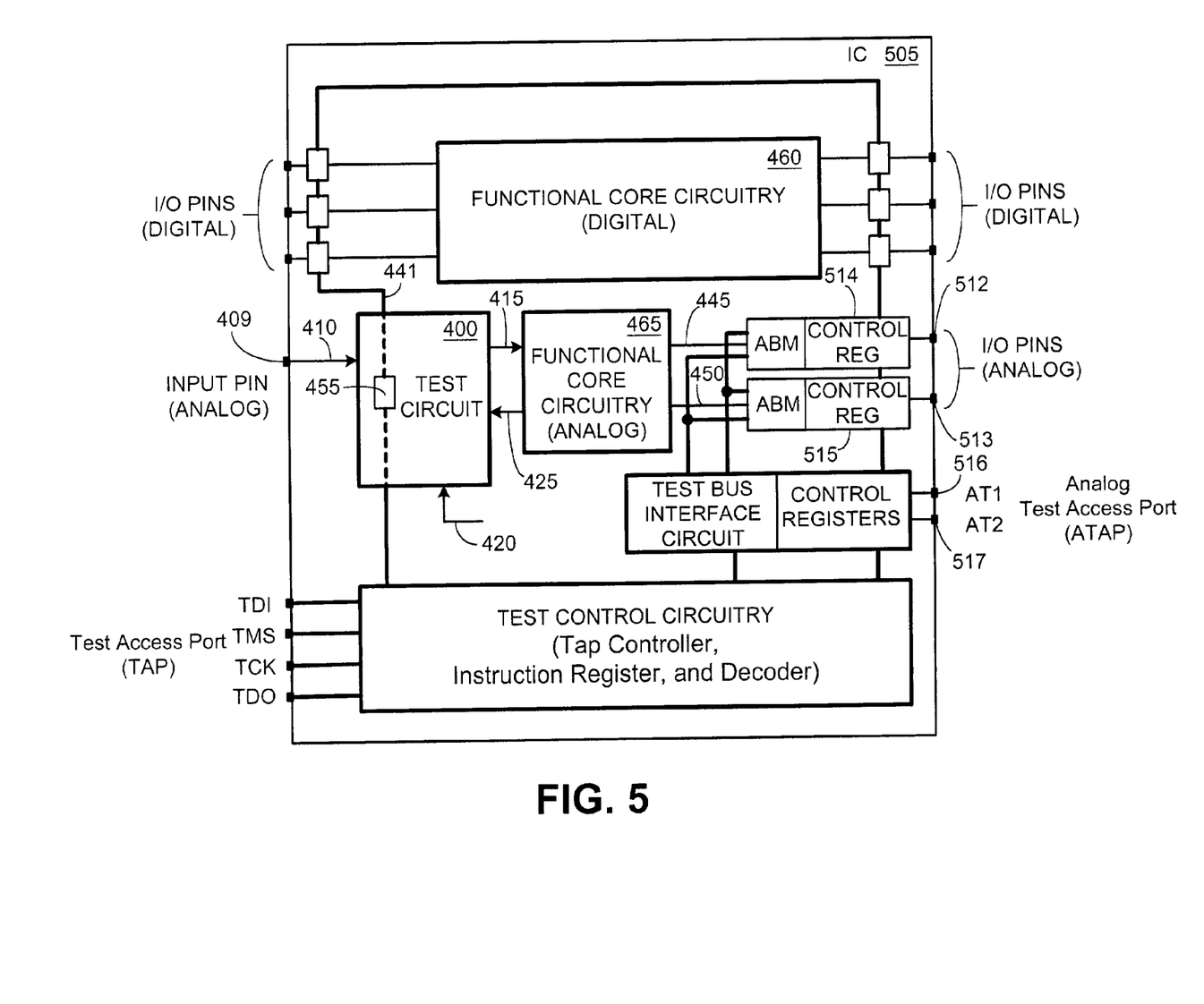
FIG. 5 depicts a mixed-signal integrated circuit incorporating the test circuit of the current invention used for analog circuit testing in compliance with an interface in accordance wit the IEEE 1149.4 standard.

FIG. 5 depicts a mixed-signal IC 505 incorporating the test circuit 400 of the current invention used for analog circuit testing in compliance with an interface in accordance with the IEEE 1149.4 standard. The hardware contained inside mixed-signal IC 505 resembles that of mixed-signal IC 300 of FIG. 3, with one main difference: addition of the test circuit 400 incorporating the boundary-scan cell 455. Boundary-scan cell 455 is cascaded with other boundary-scan cells that are connected to the digital I/O pins associated with functional core circuitry digital 460.

Figure 6:
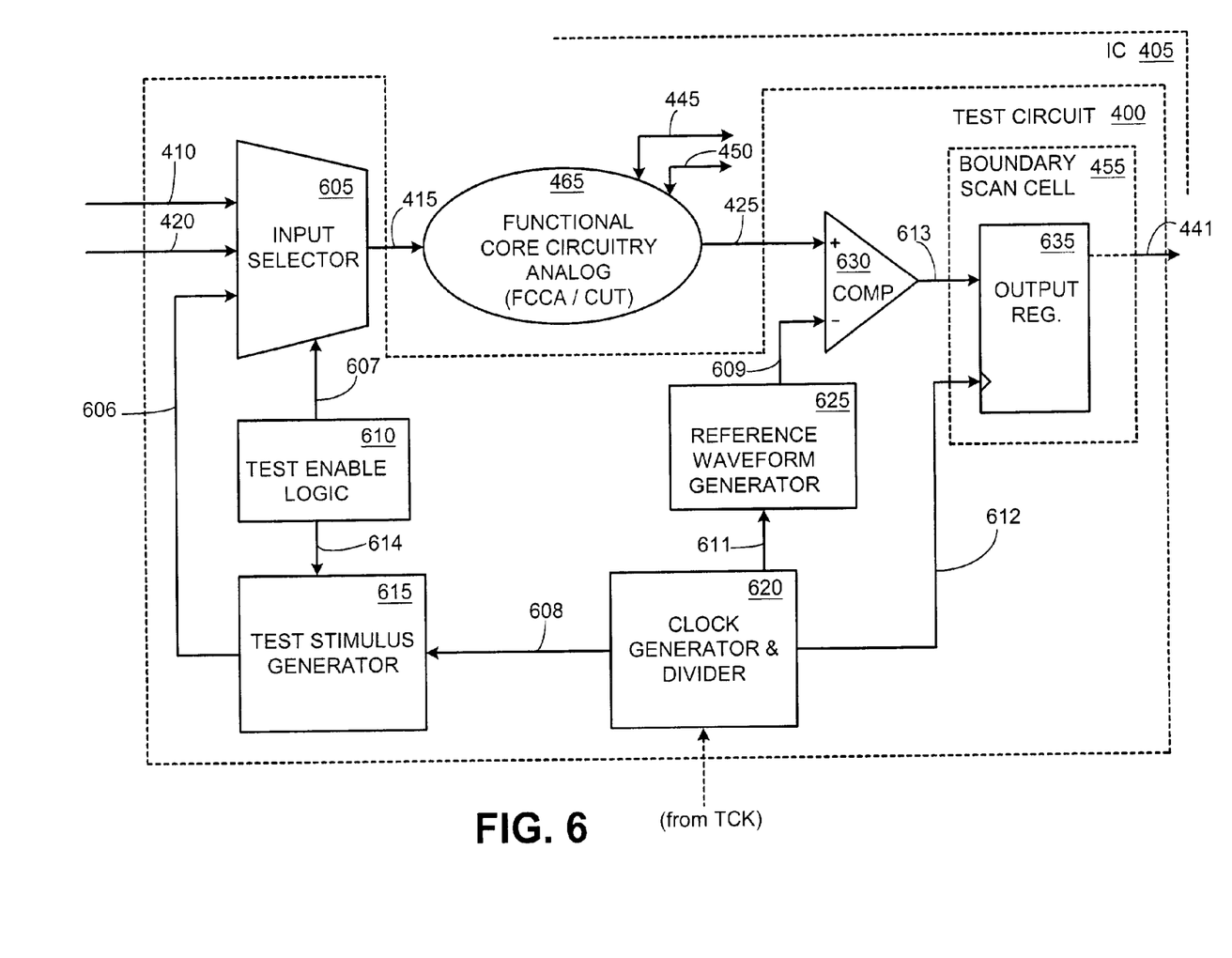
FIG. 6 illustrates the main functional blocks of the test circuit of FIG. 4 and FIG. 5.

FIG. 6 illustrates the main functional blocks of the test circuit 400 of the current invention embedded inside the mixed-signal IC 405 of FIG. 4. Signal connection 606 carries a test signal that is provided by a test-stimulus generator 615. Control logic generated by test-enable logic 610 and carried over line 607, is used by analog multiplexor (MUX) 605 to selectively route either the analog signal on signal connection 410, or the test stimulus signals on signal connections 420 or 606, into signal connection 415.

The control logic ensures that the default setting of MUX 605 causes the analog signal on signal connection 450 to be routed into signal connection 415. This analog signal enters the functional core circuitry analog (FCCA) 465 and is processed by the FCCA 465 for transmission into I/O lines, such as I/O lines 445 and 450.

When parametric, or specification testing has to be performed on the FCCA 465, which may now be referred to as the circuit-under-test (CUT), the control logic is configured to cause MUX 605 to route the test stimulus signal on signal connection 606 into signal connection 415. This test stimulus signal enters the FCCA 465 and is propagated by the FCCA 465, in the form of a test-response signal, into the output signal connection 425.

While several different types of test stimulus signals may be used, one of the test stimulus signals carried on line 606 comprises a binary-level signal that is routed via MUX 605 into FCCA 465. This binary-level signal propagates through FCCA 465, undergoing a transformation related to the transfer characteristics of the FCCA 465, before emerging as an output signal. For example, if the FCCA 465 is a low-pass filter, the high frequency components of the binary-level signal are attenuated in propagating through the FCCA 465, and the output signal emerging from the FCCA 465 has a binary wave-shape that has a slow rise time and a slow fall time that is representative of the cutoff frequency of FCCA 465. As a second example, if the FCCA 465 is an ideal analog amplifier that provides amplitude gain together with phase reversal, then the binary-level signal that is input into the FCCA 465 appears at the output of the FCCA 465 as a phase-reversed binary signal with larger amplitude.

Test-enable logic 610 generates the control logic carried on signal connection 607 in response to one of a multiplicity of test initiation triggers. Such test initiation triggers (not shown) encompass IEEE 1149.1 test messages that may be provided to mixed-signal IC 405 via the test-access port (TAP) of FIG. 4. It will be understood that, if test circuit 400 is embedded inside the mixed-signal IC 505 of FIG. 5, then the test messages may be provided in IEEE 1149.4 format. Test-enable logic 610 also generates a second control logic that is carried on signal connection 614 into test-stimulus generator 615. Signal connection 614 is a connection that is optional and may be omitted in certain applications. While shown in FIG. 6 as an exemplary connection, signal connection 614 will be explained in further detail with reference to FIG. 9.

Clock generator and divider 620 generates a multiplicity of clock signals. The multiplicity of clock signals may be derived from one or more "system" clocks, such as the clock that is fed into the TCK 462 pin of IC 405. In FIG. 6, a first clock signal carried on signal connection 612 may have a clock period that is equal to that of the TCK clock. This signal is provided as a clock input signal to output register 635, which uses it to synchronously transfer the data present on its input signal connection 613 to its output signal connection 441. Signal connection 441 is typically connected to an adjacent boundary-scan cell of IC 405 to form a boundary-scan register chain that is clocked by the TCK clock.

A second clock signal that is carried on signal connection 608 has a clock period that bears a relationship to the TCK clock, defined by a parameter N. As an example of such a parameter N, if the second clock signal is generated by dividing the TCK clock by a factor of six, N may be described as N=6. Test stimulus generator 615 uses the second clock signal to generate the test stimulus signal carried on signal connection 606 into input selector 605. For example purposes, as used later in FIG. 7A, one cycle period of this test stimulus signal may be set equal to one cycle period of the second clock signal.

A third clock signal that is carried on signal connection 611 has a clock period that bears a relationship to the TCK clock, defined by a second parameter N'. As an example of such a parameter N', if the second clock signal is generated by dividing the TCK clock by a factor of five, N' may be described as N'=5. Reference waveform generator 625 uses this third clock signal to generate a reference waveform carried over signal connection 609. For example purposes, as used later in FIG. 7B, one cycle period of this reference waveform may be set equal to one cycle period of the third clock signal.

Comparator 630 is used to convert the output signal from the FCCA 465 carried over signal connection 425 into a binary-level signal. The output signal from the FCCA 465 may be an analog signal, such as a sine-wave, a distorted binary-level pulse-train etc depending on the test-stimulus 606 and the characteristics of the FCCA 465. The comparator output which is a binary-level signal corresponding to the supply voltages provided to the comparator 630, is converted into a digital output signal by output register 635 using the clock on line 612. The operation of comparator 630 will be explained in further detail using FIGS. 7A and 7B.

Typically, the output signal of output register 635 is processed by other circuitry such as a boundary-scan register inside boundary-scan cell 455, before transmission via signal connection 441 into other boundary-scan cells of mixed-signal IC 405 as explained earlier. This configuration permits boundary scan-cell 455 to be a part of the IEEE 1149.1 boundary-scan register chain inside mixed-signal IC 405, thereby allowing IEEE 1149.1 related test formats and processes to be applied. The output signal of output register 635 is transmitted via the boundary scan chain, out of mixed-signal IC 405 into an external ATE unit. In the ATE unit, an analog waveform reconstruction block, typically implemented as a test-program software contained in the ATE, may be used to convert the binary-level output signal into representative values of the analog signal that was present on signal connection 425 from the FCCA 465. These representative values for the analog signal 425 may be used in the ATE, together with various analysis techniques, such as statistical regression analysis, spectral analysis, signature analysis etc. to analyze and compute specifications of the FCCA 465.

In addition to being embedded inside IEEE 1149.1 compliant devices, such as mixed-signal IC 405 of FIG. 4, test circuit 400 may also be incorporated inside IEEE 1149.4 compliant devices such as mixed-signal IC 505 of FIG. 5. When incorporated inside mixed-signal IC 505, the I/O lines 445 and 450 that are associated with the FCCA 465 are routed through control registers 514 and 515 that are part of the IEEE 1149.4 boundary scan test chain. Unlike FIG. 4 which uses the IEEE 1149.1 boundary scan chain that does not use the analog I/O pins 446 and 447 of mixed-signal IC 405, FIG. 5 shows mixed-signal IC 505 incorporating the IEEE 1149.4 boundary scan chain that includes the control registers 514 and 515 connected to analog I/O pins 512 and 513.

Figure 7A:
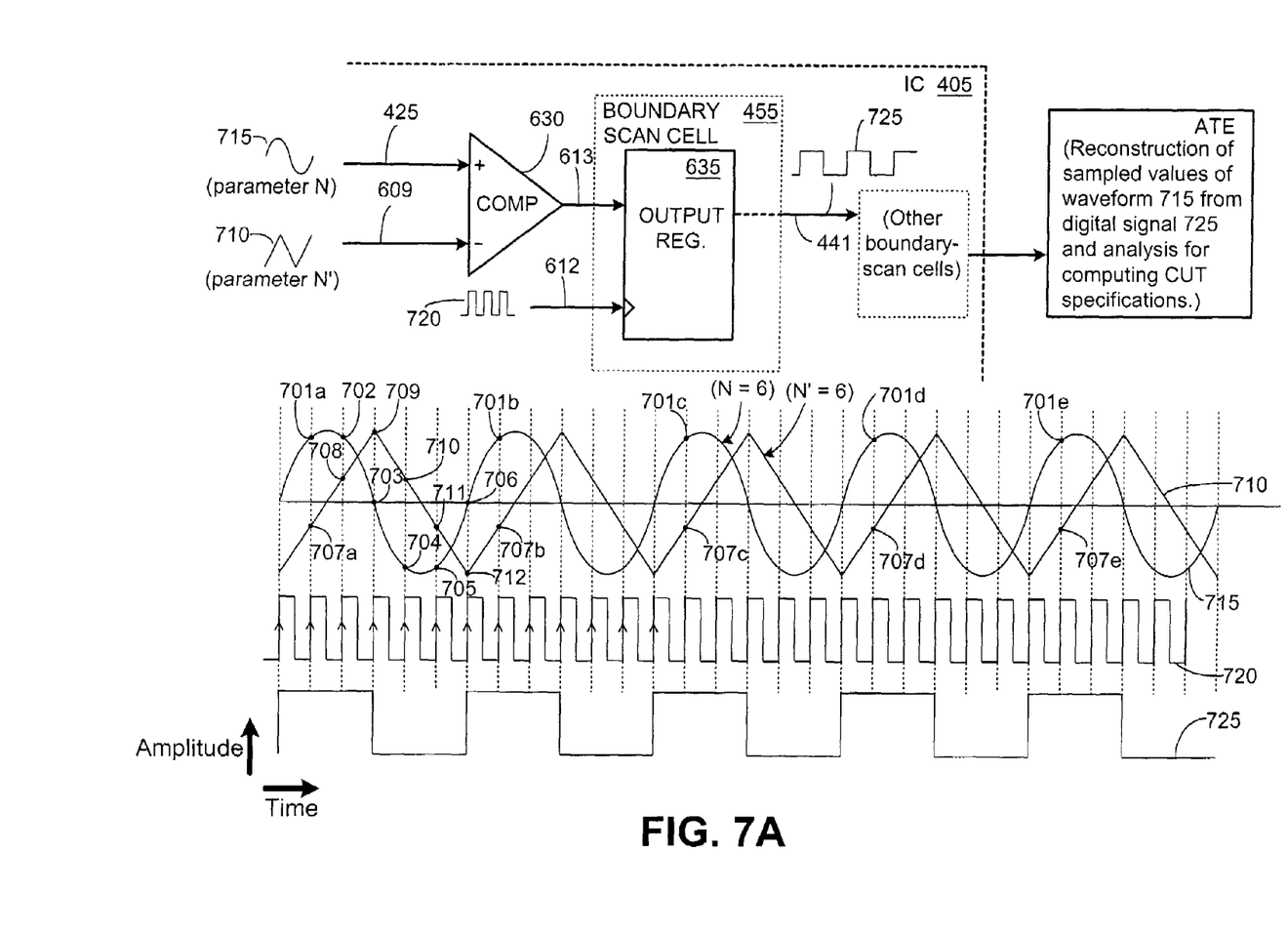
FIG. 7A illustrates an exemplary circuit that may be used to sample and digitize an analog waveform. This exemplary circuit is located in the test circuit of FIG. 6.

FIG. 7A illustrates a circuit that may be used to sample and digitize an analog waveform 715 that may be provided at the positive terminal of comparator 630. This exemplary circuit is located in the test circuit of FIG. 6, and the analog waveform 715 is the output signal from FCCA 465. A triangular waveform 710 is shown as an example of a reference waveform that may be provided at the negative terminal of the same comparator 630.

Comparator 630 operates to produce on line 613, an output "high" signal that is nominally equal to the voltage connected to the positive supply voltage pin of comparator 630, whenever the amplitude of analog waveform 715 is greater than the amplitude of reference waveform 710. The output signal on line 613 is a "low" signal that is nominally equal to the voltage connected to the negative supply voltage pin of comparator 630, whenever the amplitude of analog waveform 715 is less than the amplitude of reference waveform 710.

Output register 635 is used to "sample" the amplitude of the output signal of line 613 at specific instances in time. These instances in time, referred to as "sampling instances," are created by using the rising edges of a sampling clock 720 that is earned on signal connection 612. In FIG. 7A, parameter N is equal to six, thereby causing one cycle period of analog waveform 715 to be equal to six clock periods of sampling clock 720. Parameter N' is also equal to six, thereby causing one cycle period of reference waveform 710 to be also equal to six clock periods of sampling clock 720. Drawing attention to analog waveform 715, the six clock periods of sampling clock 720 provides six sampling instances within one cycle period of analog waveform 715. The six sampling instances are shown in FIG. 7A by amplitude points 701a, 702, 703, 704, 705, and 706.

With specific reference to the sampling instance associated with amplitude point 701a of analog waveform 715, the amplitude point 707a of reference waveform 710 is lower in comparison to the amplitude point 701a. Consequently, the output signal on line 613 is "high," and a rising edge of clock 720 causes output register 635 to generate a corresponding "high" level in output waveform 725 on signal connection 435.

In contrast, at the sampling instance associated with amplitude point 703 of analog waveform 715, the amplitude point 709 of the reference waveform 710 is higher than the amplitude point 703. Consequently, the output signal on line 613 is "low" and a rising edge of clock 720 causes output register 635 to generate a "low" level output in waveform 725 on signal connection 435. The various logic levels in the output waveform 725 can be similarly analyzed at any of the other sampling instances.

Amplitude points 701a, 701b, 701c, 701d, and 701e are shown located along a first substantially invariant amplitude level at cyclically repetitive sampling instances along analog signal 715. It will be observed that each of the corresponding comparative amplitude points 707a, 707b, 707c, 707d, and 701e of the reference waveform 710 are located at a second substantially invariant amplitude level that is always lower in comparison to the first level. As the difference in amplitude between the first amplitude level and the second amplitude level is relatively large and relatively constant, small variations in the amplitude levels of the analog waveform 715 at the sampling instances, for example at amplitude points 701b and 701d, will not be captured by the comparator 630. A similar analysis may be carried out at other cyclically repetitive sampling instances associated with other substantially invariant amplitude levels.

Figure 7B:
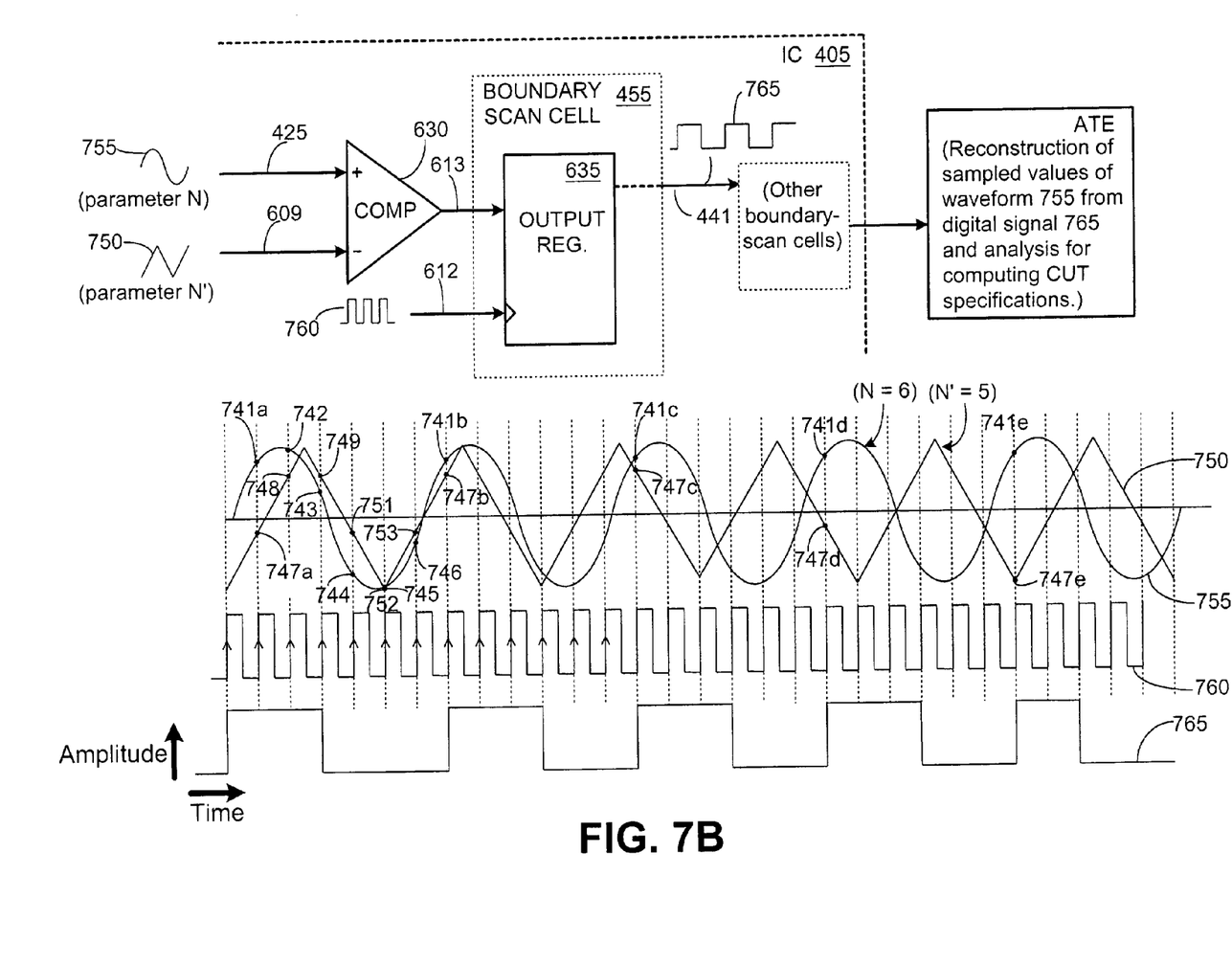
FIG. 7B illustrates the exemplary circuit of FIG. 7A, configured to sample and digitize an analog waveform using a Vernier technique of the current invention.

FIG. 7B illustrates the exemplary circuit of FIG. 7A, configured to utilize the principles behind the Vernier technique of the current invention used to sample and digitize an analog waveform 755 that may be provided at the positive terminal of comparator 630. Triangular reference waveform 750 is shown as an example of a reference waveform that may be provided at the negative terminal of the same comparator 630.

While the hardware circuit connections and operation of the comparator 630 and the output register 635 may be identical to that shown in FIG. 7A, the signals being communicated into this circuit bear a different relationship to each other than that which was described in FIG. 7A. In FIG. 7A both N and N' were equal to six, whereas in FIG. 7B, N is equal to six while N' is equal to five. Under this condition, one cycle period of analog waveform 755 is equal to six clock periods of sampling clock 760, and one cycle period of reference waveform 750 is equal to five clock periods of sampling clock 760.

The six sampling instances inside one cycle period of analog waveform 755 are designated by the six amplitude points 741a, 742, 743, 744, 745, and 746 of analog waveform 755, while the five sampling instances inside one cycle period of reference waveform 750 are designated by the sampling points 748, 749, 751, 752, and 753. The logic levels of output signal 765 can be identified by comparing the amplitude levels of the analog waveform 755 to the reference waveform 750, at the rising edges of sampling clock 760.

Drawing attention to amplitude points 741a, 741b, 741c, 741d, and 741e of analog waveform 755, and the corresponding amplitude points 747a, 747b, 747c, 747d, and 747e of reference waveform 750, it can be seen that the relative amplitude difference between corresponding amplitude points of the two waveforms vary from cycle to cycle. For example, while reference amplitude point 747a is clearly below 741a, reference amplitude point 747b is only slightly below 741b, and reference amplitude point 747e is well below 741e.

This comparative amplitude relationship between the two waveforms over time, allows any one of several selected amplitude points of analog waveform 755 to be compared against a multiplicity of different amplitude values of reference waveform 750 over multiple cycles, thereby providing a higher degree of comparator resolution than that obtained using the waveforms of FIG. 7A. This enables any small variations in the amplitude levels of the analog waveform 715 at the sampling instances, for example at amplitude points 741b and 741c, to be captured by the comparator 630.

The Vernier technique of the current invention relies on suitable selection of values for N' and N. These two values are selected such that the ratio of max(N',N) to min(N',N) will equal a non-integer value. With reference to the circuit of FIG. 7B max(N',N)=6, and min(N',N)=5. Therefore ratio of max(N',N) to min(N',N) will equal 1.2, which is a non-integer value. Additionally, the optimal values for N and N' occur when the greatest common factor (GCF) between N and N' is equal to one. Furthermore, N' is selected to be numerically large in value so as to maximize measurement accuracy by minimizing the inherent quantization error of Vernier technique. The higher the value of N', the larger the number of comparison voltage levels created by reference waveform 750, and consequently the lower the quantization error.

Referring back to FIG. 6, a test process for using test circuit 400 may involve the determination of a suitable analog test-stimulus signal by carrying out simulation and measurements upon a set of "reference" ICs corresponding to a particular manufacturing process. In a test system, the test process is then carried out by providing this analog test stimulus waveform via signal connection 415 into an FCCA 465 contained inside the first such reference ICs. The resulting digital output signal that appears on signal connection 441 is routed through the boundary scan chain of this first IC and into an ATE system. In the ATE system, the digital output signal is processed and the result is stored as reference parameters using techniques such as analog waveform reconstruction followed by regression analysis etc.

Once these reference parameters corresponding to the test-procedure of a specification are stored, the analog test stimulus may be applied to an IC-under-test. The resulting digital output signal from the IC-under-test is provided to the ATE system, where it is processed and analyzed with reference to the earlier-stored reference parameters. While this processing may be typically implemented using software programs, it may also be implemented using hardware circuitry. The results of the analysis provide specification information of the FCCA 465 inside the IC-under-test.

Figure 8A:
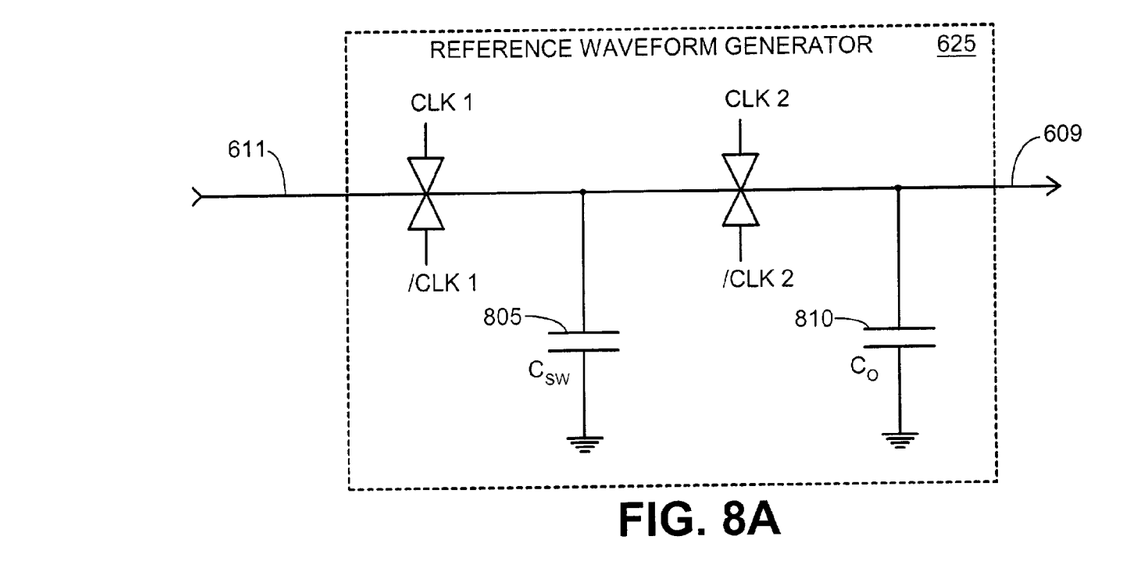
FIG. 8A illustrates the circuitry of the reference waveform generator in the test circuit of the current invention.
Figure 8B:
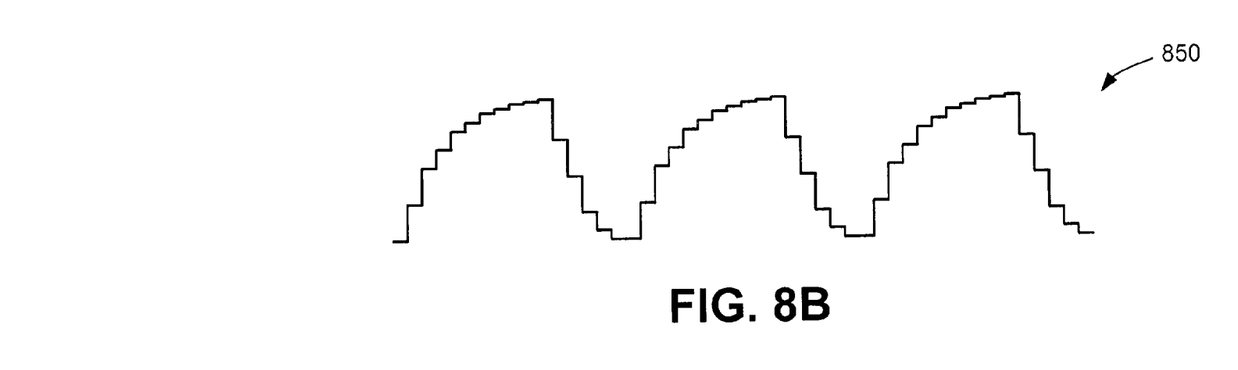
FIG. 8B shows a typical waveform that is generated by the reference waveform generator in the test circuit of the current invention.

Referring to FIG. 7B, reference waveform 750 may be generated using a reference waveform generator 625 that is described in more detail in FIG. 8A. The signal carried on signal connection 611 into waveform generator 625 of FIG. 8A is generated in the clock generator and divider 620 by dividing clock signal 760 of FIG. 7B by a factor of five. CLK1, /CLK1 (inverted version of CLK1), CLK 2, and /CLK 2 (inverted version of CLK2) are derived from a system clock (not shown) that is generated in clock generator and divider 620, using combinatorial delay elements such that CLK1 (/CLK1) and CLK2 (/CLK2) are non-overlapping. These four waveforms are used in conjunction with capacitors 805 and 810 to form a simple switched-capacitor resistor-capacitor (RC) circuit that generates the waveform shown in FIG. 8B.

Figure 9:
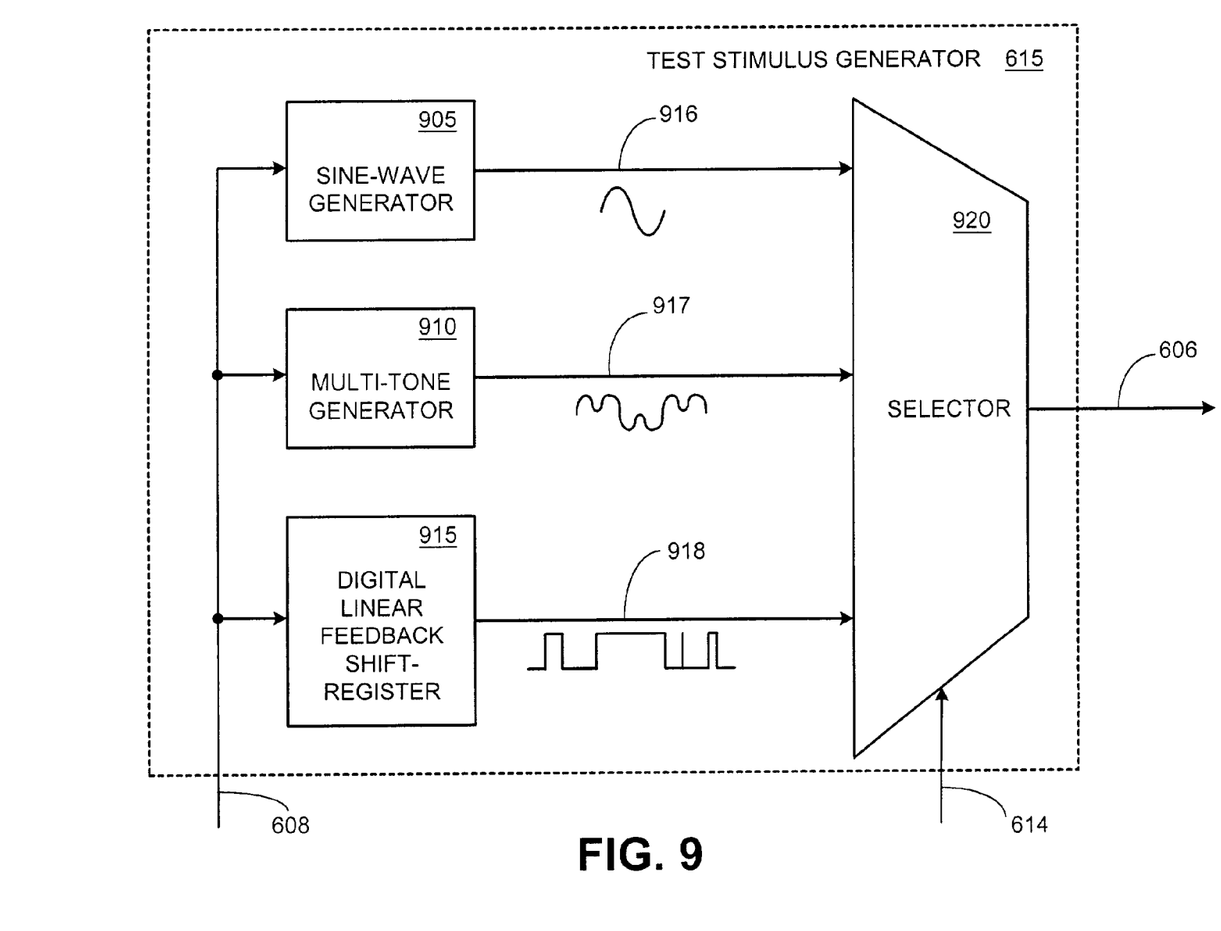
FIG. 9 illustrates the circuitry of the test stimulus generator in the test circuit of the current invention.

FIG. 9 illustrates the circuitry of the test stimulus generator 615 used in the test circuit of FIG. 6. Three exemplary signal generation units, in the form of the sine-wave generator 905, multi-tone generator 910, and digital linear feedback shift register (LFSR) 915 are shown connected into a selector 920.

Sine-wave generator 905 produces a sine-wave of a test frequency provided by the clock on signal connection 608. The sine wave is transported on line 916. Multi-tone generator 910 generates a composite signal that may comprise a combination of several sine-waves that are generated using the clock on signal connection 608. Such a composite signal allows creation of waveforms that have varying shapes, and multiple frequency components. The composite signal is carried on line 917. LFSR 915 is used to generate a digital pulse train that is carried on line 916 and may comprise a series of pulses of varying widths, i.e. a binary-level, pulse width modulated (PWM) waveform. This pulse train may be generated using the clock on signal connection 608. Control logic, referred to earlier as second control logic, provided on signal connection 614, allows selector 920 to selectively route one of the three signals on lines 916, 917, or 918 to output signal connection 606.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

At least the following is claimed:

1. A method for testing integrated circuits comprising:
   receiving a binary-level input signal in an analog circuit located inside an integrated circuit;
   converting an analog output signal from the analog circuit into a digital output signal;
   transmitting the digital output signal to a circuit tester; and
   analyzing the digital output signal in the circuit tester to compute at least a first specification of the analog circuit.

2. The method of claim 1, wherein the binary-level input signal is received in the analog circuit via a digital input connection of the integrated circuit, the analog output signal is converted to the digital output signal by comparing the amplitude of the analog output signal to the amplitude of a reference waveform at multiple sampling instances corresponding to transition edges of a system clock, and the digital output signal is transmitted using the system clock out of a digital output connection of the integrated circuit.

3. The method of claim 2 wherein one cycle-period of the binary-level input signal is equal to N number of cycle-periods of the system clock, one cycle-period of the reference waveform is equal to N' number of cycle-periods of the system clock, and the ratio of max(N', N) to min(N', N) equals a non-integer value.

4. The method of claim 3, wherein the digital input connection of the integrated circuit and the digital output connection of the integrated circuit comprise an apparatus for testing the integrated circuit using the IEEE 1149.1 boundary scan standard.

5. The method of claim 1, wherein the binary-level input signal and a reference waveform are generated using a system clock in a test stimulus generator located inside the integrated circuit, the analog output signal is converted to the digital output signal by comparing the amplitude of the analog output signal to the amplitude of the reference waveform at multiple sampling instances corresponding to transition edges of the system clock, and the digital output signal is transmitted using the system clock out of a digital output connection of the integrated circuit.

6. The method of claim 5, wherein one cycle-period of the binary-level input signal is equal to N number of cycle-periods of the system clock, one cycle-period of the reference waveform is equal to N' number of cycle-periods of the system clock, and the ratio of max(N', N) to min(N', N) equals a non-integer value.

7. The method of claim 6, wherein the digital output connection of the integrated circuit comprises an apparatus for testing the integrated circuit using the IEEE 1149.1 boundary scan standard.

8. The method of claim 7, wherein the test stimulus generator is controlled by a circuit tester using messages that are compliant with the IEEE 1149.1 boundary scan standard, and the digital output signal transmitted out of the digital output connection is received in the circuit tester in compliance with the IEEE 1149.1 boundary scan standard.

9. A system for testing integrated circuits comprising:
   a binary-level test-stimulus generator that transmits a binary-level input signal into an analog circuit located inside an integrated circuit;
   a converter that converts an output signal from the analog circuit into a digital output signal;
   a boundary-scan register chain that transmits the digital output signal out of the integrated circuit; and
   a test equipment that receives the digital output signal from the integrated circuit and analyzes the digital output signal to compute at least a first specification of the analog circuit.

10. The system of claim 9, wherein the test equipment located external to the integrated circuit comprises the binary-level test-stimulus generator, and the binary-level input signal is provided to the analog circuit via an analog input pin of the integrated circuit.

11. The system of claim 9, wherein the converter comprises a comparator and an output register to convert the analog output signal into the digital output signal by comparing the amplitude of the analog output signal to the amplitude of a reference waveform at multiple sampling instances corresponding to transition edges of a system clock.

12. The system of claim 11, wherein one cycle-period of the binary-level input signal is equal to N number of cycle-periods of the system clock, one cycle-period of the reference waveform is equal to N' number of cycle-periods of the system clock, and the ratio of max(N', N) to min(N', N) equals a non-integer value.

13. The system of claim 12, further comprising a reference waveform generator that generates the reference waveform using the system clock, and a test-stimulus generator that generates the binary-level input signal using the system clock.

14. The system of claim 13, wherein the digital output signal is transmitted out of the integrated circuit via a digital output connection of the integrated circuit, and the digital output connection of the integrated circuit comprises an apparatus for testing the integrated circuit using the IEEE 1149.1 boundary scan standard.

15. The system of claim 14, wherein the binary-level test-stimulus signal generator is located inside the integrated circuit and is controlled by the test equipment using messages that are compliant with the IEEE 1149.1 boundary scan standard, the output register is connected to the boundary-scan register chain that is compliant with the IEEE 1149.1 boundary scan standard, and the system clock is provided via a TCK input connection that is compliant with the IEEE 1149.1 boundary scan standard.

16. A method for testing analog circuits comprising:
generating a binary-level test stimulus signal whose cycle-period N is equal to a first number of cycle-periods of a system clock;
generating a reference signal whose cycle-period N' is equal to a second number of cycle-periods of the system clock;
providing the binary-level test signal to an analog circuit-under-test;
providing an output signal from the analog circuit-under-test to a first input of an analog comparator circuit;
providing the reference signal into a second input of the analog comparator circuit;
providing an output signal from the analog comparator circuit to a register that is clocked by the system clock so as to produce a digital output data signal; and
analyzing the digital output signal to compute at least a first specification of the analog circuit-under-test.

17. The method of claim 16, wherein the ratio of max(N', N) to min(N', N) equals a non-integer value.

18. An IC test system stored on a computer-readable medium, the test system comprising:
logic configured to transmit a message to initiate testing of an analog circuit located inside of an integrated circuit configured to perform a digital boundary scan test, the testing of the analog circuit comprising:
providing a binary-level input signal to the analog circuit;
converting an analog output signal from the analog circuit into a digital output signal; and
transmitting the digital output signal out of the integrated circuit; and
logic configured to analyze the digital output signal to provide at least one specification of the analog circuit.

19. The system of claim 18, wherein the integrated circuit is configured for implementing the IEEE 1149.1 boundary scan standard.

20. The system of claim 19, wherein the message satisfies the IEEE 1149.1 boundary scan standard.

21. The system of claim 18, wherein the integrated circuit is configured for implementing the IEEE 1149.4 boundary scan standard.

22. The system of claim 21, wherein the message satisfies the IEEE 1149.4 boundary scan standard.

* * * * *